US005968196A

United States Patent [19]

Ramamurthy et al.

[11] Patent Number: 5,968,196

[45] Date of Patent: Oct. 19, 1999

[54] CONFIGURATION CONTROL IN A PROGRAMMABLE LOGIC DEVICE USING NON-VOLATILE ELEMENTS

[75] Inventors: Srinivas Ramamurthy, San Jose; Neal Berger, Cupertino, both of Calif.; James Fahey, Jr., Aix en Provence, France; Geoffrey S. Gongwer, Campbell, Calif.; William J. Saiki, Mountain View, Calif.; Eugene Jinglun Tam, San Jose, Calif.

[73] Assignee: Atmel Corporation, San Jose, Calif.

[21] Appl. No.: 09/063,872

[22] Filed: Apr. 21, 1998

[51] Int. Cl.$^{6}$ .................................................... G01R 31/28

[52] U.S. Cl. ........................... 714/727; 714/725; 326/39; 395/800.37

[58] Field of Search .................................... 714/718, 724, 714/725, 726, 727, 733, 734; 326/37, 38, 39; 395/284, 800.37

[56] References Cited

U.S. PATENT DOCUMENTS

| | | | |
|---|---|---|---|
| 4,717,912 | 1/1988 | Harvey et al. | 340/825.83 |
| 5,281,864 | 1/1994 | Hahn et al. | 307/272.2 |
| 5,323,107 | 6/1994 | D'Souza | 324/158 P |
| 5,325,368 | 6/1994 | James et al. | 371/22.3 |
| 5,347,520 | 9/1994 | Simpson et al. | 371/22.3 |
| 5,377,198 | 12/1994 | Simpson et al. | 371/22.3 |
| 5,396,501 | 3/1995 | Sengoku | 371/22.3 |
| 5,412,260 | 5/1995 | Tsui et al. | 326/39 |
| 5,444,716 | 8/1995 | Jarwala et al. | 371/22.3 |
| 5,450,415 | 9/1995 | Kamada | 371/22.3 |
| 5,471,481 | 11/1995 | Okumoto et al. | 371/22.3 |
| 5,477,493 | 12/1995 | Danbayashi | 365/201 |
| 5,490,151 | 2/1996 | Feger et al. | 371/22.3 |
| 5,510,704 | 4/1996 | Parker et al. | 324/158.1 |
| 5,515,505 | 5/1996 | Ishizuka | 395/183.06 |
| 5,517,637 | 5/1996 | Bruce, Jr. et al. | 395/500 |
| 5,519,355 | 5/1996 | Nguyen | 327/565 |
| 5,519,715 | 5/1996 | Hao et al. | 371/22.3 |
| 5,561,629 | 10/1996 | Curd | 365/185.21 |
| 5,631,911 | 5/1997 | Whetsel, Jr. | 324/73.1 |
| 5,682,391 | 10/1997 | Narayanan | 371/22.3 |
| 5,734,868 | 3/1998 | Curd et al. | 395/500 |
| 5,764,076 | 6/1998 | Lee et al. | 326/38 |
| 5,768,288 | 6/1998 | Jones | 714/733 |
| 5,841,867 | 11/1998 | Jacobson et al. | 380/25 |
| 5,870,410 | 2/1999 | Norman et al. | 714/725 |

*Primary Examiner*—Emmanuel L. Moise
*Attorney, Agent, or Firm*—Thomas Schneck; John P. McGuire, Jr.

[57] ABSTRACT

A boundary scan test circuit (JTAG) interface is used to provide data for a set of configuration latches within a Configuration Register. The Configuration Register is included within the JTAG structure as a Test Data Register (TDR). Each configuration bit within the Configuration Register consists of a Configuration Latch, and each configuration latch has an output used as a configuration control signal within an output logic macrocell. The configuration register's input signal is selectably provided from either a set of serially connected configuration bit non-volatile element sense latches or from the JTAG Test Data In (TDI) data pin for reconfiguration, prototyping, and testing.

18 Claims, 4 Drawing Sheets

*Fig.* 1

CONFIGURATION CONTROL IN A PROGRAMMABLE LOGIC DEVICE USING NON-VOLATILE ELEMENTS

FIELD OF THE INVENTION

This invention relates to semiconductor integrated circuits and, more particularly, to configuration of programmable logic devices.

BACKGROUND ART

Programmable logic devices (PLDs) that implement the use of non-volatile elements are well known. In the early development of PLDS, an array was used which basically consisted of a grid of conductors forming rows and columns with a fusible link at each cross point. The data output was programmed to be the desired combinatorial function of the device's address signals. Later, integrated circuits (ICs) were designed specifically for the purpose of generating sum-of-product (SOP) logic. The non-volatile memory elements were connected within the IC in such a way as to form logical AND gates (product terms). By connecting the outputs of two or more AND gates as inputs to a logical OR gate, the output of the OR gate would constitute an SOP logic function. The SOP form was chosen because it is widely known in the art that a combinational function of any complexity may be reduced to SOP form. Therefore, any such combinatorial function may be realized within such an IC, if there are sufficient such AND and OR gates available within the IC.

Further evolution of PLDs involved the addition of configuration bits (CBs) to allow programmable alteration of the output format of the SOP function. This led to the development of output logic macrocells (OLMCs). The OLMC is made of programmable logic circuits that can be configured either for a combinational output or input or for a registered output. In the registered mode, the output comes from a flip-flop. OLMC combinational mode configurations are automatically set by programming. FIG. 4 shows a block diagram of a typical OLMC 500 that has two configuration bits. The first configuration bit, 501, determines whether the OEMC operates in registered mode (through the flip-flop 504) or in combinational mode. The second configuration bit, 502, determines whether the output is "active-LOW" or "active-HIGH". The 1 of 4 multiplexer 505 connects one of its four input lines to the output tristate buffer 507 based on the states of the two configuration bits, 501 and 502. The 1 of 2 multiplexer 506 connects either the output 508 of the tristate buffer 507 or the Q output of the flipflop 504 back through a buffer 509 to the programmable array. In a typical PLD, several OLMCs are used, one for each SOP term, with a common clock pin for all OLMC registers. More recent product term based PLDs have included many more configuration bits within each OIMC in order to increase device flexibility without increasing the number of product terms. In addition to output polarity and registered vs. combinatorial output signal selection, these CBs perform functions such as: routing individual product terms for use other than as OR gate inputs, selecting between alternative clock, set and preset sources for device registers, and selecting between alternative output enable functions.

Including many CBs for each OLMC results in OLMCs that can be configured in any of a large number of ways. (For N binary level CBs, up to $2^N$ such configurations may be possible.) One of the difficulties involved with a large amount of configurations is that the IC manufacturer has to program each OLMC to each of the possible configurations (potentially $2^N$ combinations), and test each configuration to insure that all of the configurations operate correctly. Although the amount of testing may be somewhat reduced by programming and testing CBs that control independent functions separately, testing CBs constructed from non-volatile elements may be prohibitively expensive. For example, some such non-volatile elements take 100 msec or longer to erase and reprogram. Non-volatile element programming often takes even longer than erasure. As the testing of high density, performance PLDs often has a cost that is based on time, any additional time required for erasing and reprogramming the device adds more to the cost of producing the device. It is therefore beneficial to be able to minimize the amount of time required to erase and reprogram the CBs during the testing phase of manufacturing the PLDS.

One method that can be used to provide a faster means for reprogramming the CBs is shown in FIG. 5. In this method, a bistable configuration latch (CL) 603 is included within the IC for each configuration bit (CB) 604. The output of the CL 603 is then used by the macrocell to generate the configuration control signal 605. Upon initial power-up of the IC, the Sense Enable Signal 601 is pulsed, allowing the state of the CL 603 to be set by the non-volatile element of the CB 604. Subsequently, the CL 603 may be set by a separate data input signal by raising the Override Enable Signal 602, thereby overriding the non-volatile data previously stored in the latch. Simple bistable latches can be set in a few nanoseconds or less, so this significantly reduces the time required for changing the CB's logic state. By including a CL for each CB, the time required for testing CB operation is no longer limited by CB reprogramming, but rather by how many test vectors need to be asserted for each configuration and how quickly the vectors can be applied. Since advanced test equipment can apply the test vectors extremely fast, the overall time and cost of configuration bit testing can be significantly reduced.

However, previous designs of such CL test capability have required the use of many external device pins to provide input data for the latches. The large number of pin connections complicates test hardware, adding time and cost to the development and sustaining of such hardware. Many methods have been developed for addressing other IC test requirements, some of such methods use a minimal number of external device pins. One such method is described in IEEE specification 1149.1, commonly referred to as the Joint Test Action Group (JTAG) specification. FIG. 6 shows a block diagram of the external pin connections and internal circuitry required to implement JTAG testing. This method teaches the use of an Instruction Register (IR) 701, a Test Access Port (TAP) 704, a TAP controller 703 containing a TAP State Machine, and Test Data Registers (TDRs) 702 to implement test functions using a standardized 4 pin (or optionally 5 pin) external interface. The 4 (or 5) pin external interface is known as the Test Access Port (TAP) 704. Besides the small number of external pins required, this JTAG method also has the advantage of being useful for a wide number and variety of device test and operational functions. And since this method is standardized, development of test system hardware and software to support new test features using this method is relatively simple and therefore inexpensive for both the device manufacturer and the device user. More details regarding the implementation of the JTAG method will be provided below.

SUMMARY OF THE INVENTION

It is therefore the object of this invention to devise a system by which PLDs containing non-volatile elements for realizing product terms may be reconfigured by using latches which can override the configuration bit non-volatile elements, with the device interface using a minimal number of external device pins.

In this invention, a serial data stream is used to provide data for a set of configuration latches (CLs). In the preferred embodiment, the JTAG interface is used to provide data to a Configuration Register (CR). The CR is included within the JTAG structure as a Test Data Register (TDR). Each configuration bit (CB) within the CR consists of a CL, and each CL has an output used as a configuration control signal within a macrocell. The CR's input signal is selectably provided from either a set of serially connected CB non-volatile elements' sense latches or from the JTAG Test Data In (TDI) data pin for reconfiguration and testing.

Alternative embodiments anticipated by this invention include: parallel data connection from individual CB non-volatile elements to Configuration Register bits, multiple-parallel CRs, CL and non-volatile element outputs logically combined to produce configuration control signals and the addition of a control signal applied to the CBs or CLs so that the configuration control signals are held in a fixed state while the CBs are being programmed or erased, or while data is being input to the configuration latches. Additionally, this invention's system can be used for controlling programmable bits other than those within a macrocell (e.g. security bits, pinout control options, global logic configuration control bits, speed/power options) within a PLD containing only non-volatile elements for realizing product terms.

The various embodiments of this invention are described in detail in the following description.

BEST MODE FOR CARRYING OUT THE INVENTION

Figure 1:
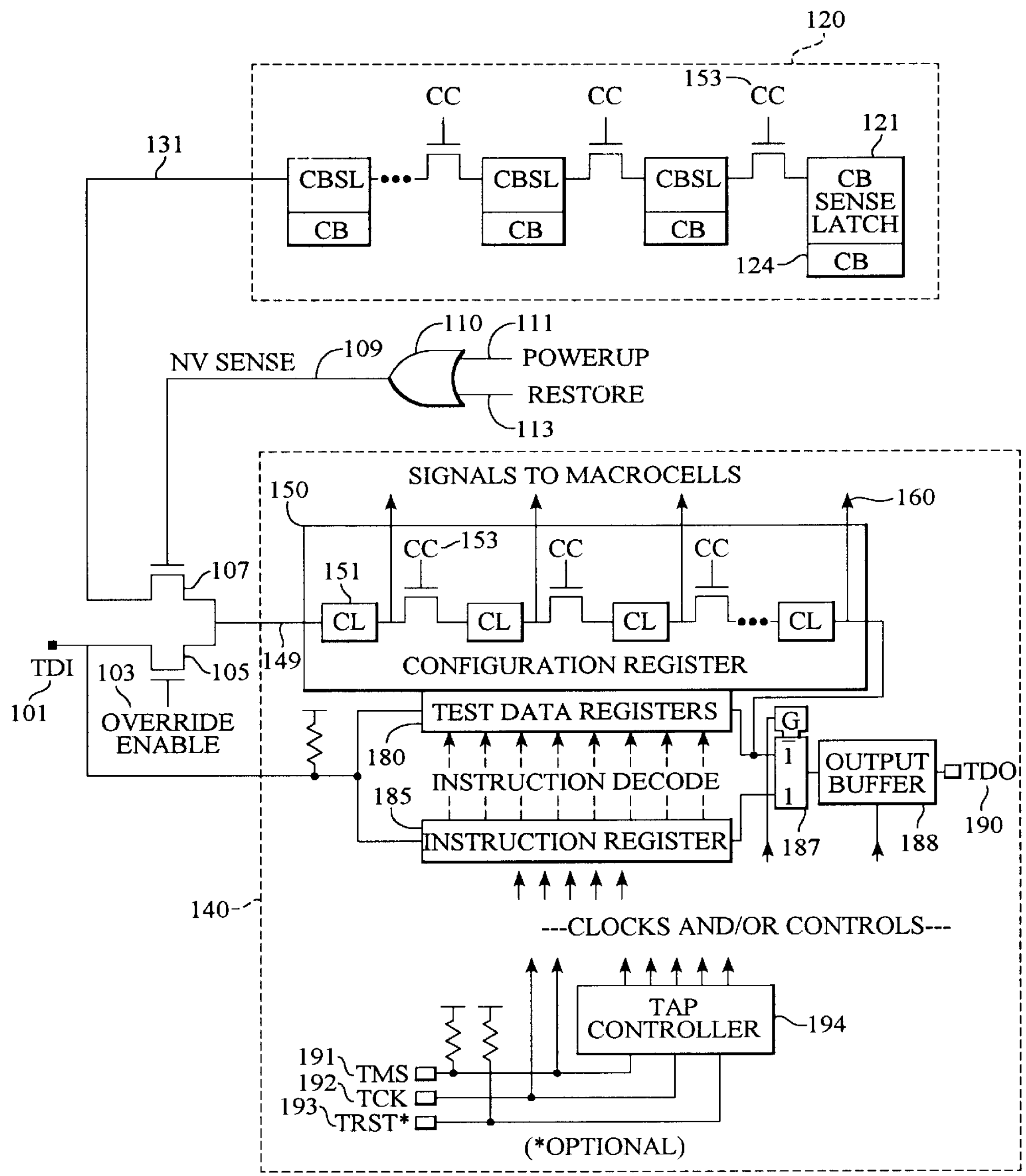
FIG. 1 shows a block diagram/schematic of the preferred embodiment of the invention illustrating the invention as implemented in the standard JTAG test structure.

Referring to FIG. 1, the JTAG interface, commonly known as a Boundary-Scan test circuit, 140 is used to provide data to a Configuration Register (CR) 150.

As explained previously, the basic architecture of the boundary-scan test circuit 140 consists of an Instruction Register 185, a Test Access Port (TAP) controller 194, Test Data Registers 180 and a Test Access Port. The Test Access Port consists of four or five pins on the IC package that are dedicated to Boundary Scan and are not shared with any other functions. These pins are used with a simple protocol to communicate with on-chip Boundary-Scan logic. The protocol is driven by two of the pins, Test Clock (TCK) 192 and Test Mode Select (TMS) 191. (The protocol is also driven by a third pin, if the optional Test Reset (TRST) 193 pin is used.) The remaining two pins of the Test Access Port are for serially shifting data into and out of the IC, these pins being called Test Data In (TDI) 101 and Test Data Out (TDO) 190. The TAP controller 194 is a simple finite state machine with 16 states located on the IC die. The TAP controller 194 recognizes the communication protocol and generates internal control signals used by the remainder of the Boundary Scan logic. The TAP controller 194 is driven by the signals of the TCK 192 and TMS 191 (and optionally TRST 193) test pins.

The Instruction Register 185 is controlled by the TAP controller 194 and can be placed between TDI 101 and TDO 190 for loading (and unloading) with serially shifted data. The Instruction Register 185 is used to set the mode of operation for one or more test data registers 180. (The instruction modes and rules for adding user-defined instructions are described in the above referenced IEEE Standard 1149.1.) Each Instruction Register cell comprises a shift register flip-flop and a parallel output latch. The shift registers hold the instruction bits moving through the instruction register. The latches hold the current instruction. The minimum size of the Instruction Register is two cells. The size of the register dictates the size of the instruction code that can be used, as the code size must match the length of the register.

The test data registers 180 are placed between the TDI pin 101 and the TDO pin 190. Two test data registers are always required to be present on JTAG component, the Bypass Register and the Boundary Register. The Boundary Register is used to control and observe activities on the IC's input and output pins. The Bypass Register shortens the scan chain to a single cell, which is useful when testing other boundary-scan components on a board. Additional test data registers are optional. The test data is shifted through the test data register 180 to a multiplexer 187, and then through an output buffer 188 to the TDO pin 190. For complete details, one may refer to the above referenced IEEE Standard 1149.1, IEEE Standard Test Access Port and Boundary-Scan Architecture.

In the present invention, the CR 150 is included within the JTAG structure as a test data register 180. Each bit in the CR 150 consists of a configuration latch (CL) 151. Each CL 151 has an output that is used as a configuration control signal 160 within a macrocell. The input data signal 149 for the CR 150 is selectably provided from either a set of serially connected configuration bit non-volatile element's sense latches 120 or from the JTAG Test Data In (TDI) data pin 101 that is used for reconfiguration and testing.

The system is initiated upon an initial power-up signal 111 which is processed through an OR gate 110 to produce the non-volatile element' sensing signal (NV sense signal) 109. Upon initial power-up, the states of the non-volatile elements are sensed in parallel and are stored in the Configuration Bit sense latches (CBSL) 120 (shown as a series of individual CB sense latches, 121, and synchronized by a Configuration Clock (CC) 153.) The NV sense signal 109 is processed to the gate of FET 107, which switches on the FET 107, thus processing the Sense Latch Output Signal 131 through the FET 107 to the Configuration Register input 149. The Configuration Clock (CC) 153 is toggled for K clock cycles, where K is the Configuration Register length in bits. In this manner, the non-volatile element' data, which was stored in the Configuration Bit Sense latches 120, is loaded into the Configuration Register 150 upon power-up. Due to the speed of the latches, this process is very fast.

After the power-up stage, testing may be initiated by activating the Override Enable Signal 103 to the gate of FET 105. This enables the JTAG TDI data input pin 101 to be used as the CR data input 149. (It is noted that the override enable signal 103 should be used after the power-up stage has been completed, so as to avoid the situation where a power-up signal is sent to the FET 107 at the same time as the override enable signal 103 is sent to FET 105, which would cause conflicting signals to occur.) The JTAG TDI data input pin 101 can then be used to process test configuration bits into the configuration register 150 in order to carry out the testing. Since the standard JTAG test specification is used, standard industry test methods may be used. (Again, one may refer to IEEE Standard 1149.1, IEEE Standard Test Access Port and Boundary-Scan Architecture, for more detail on how the testing is implemented.)

After the testing has been completed, the Restore signal 113 may be used to initiate the same configuration load sequence performed during power-up. This provides a way to set the configuration latch states to those stored in the configuration bit's non-volatile elements without having to change the power supply level.

One of the advantages of the present invention is that one can serially load different configurations into the output macrocells without having to erase and reprogram the non-volatile elements. Thus, this process is much faster than other processes in which the non-volatile elements have to be erased and reprogrammed. Having to erase and reprogram the non-volatile elements takes considerable test time as, after erasing and reprogramming, the configuration bits need to be reloaded to check the functionality of the macrocells. Additionally, this system avoids the problems associated with multiple erasures of the non-volatile elements, such as excessive wear due to breakdown of the dielectric material. This process can also be used for prototyping of the integrated circuit chips.

Figure 2:
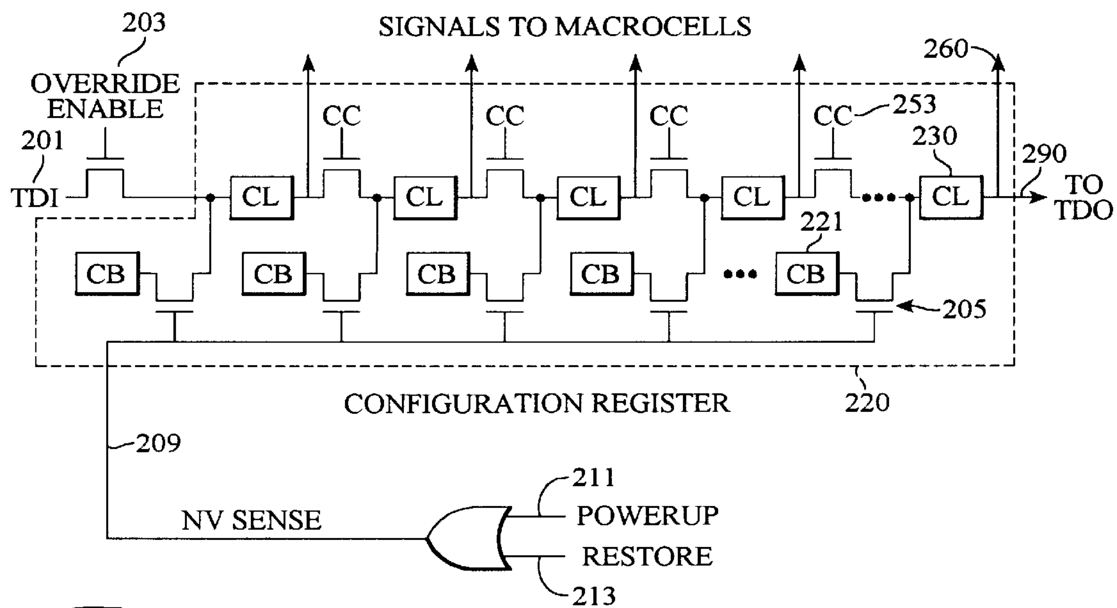
FIG. 2 shows a block diagram/schematic of an alternative embodiment of the present invention, illustrating just the configuration register portion of the JTAG test structure.
Figure 4:
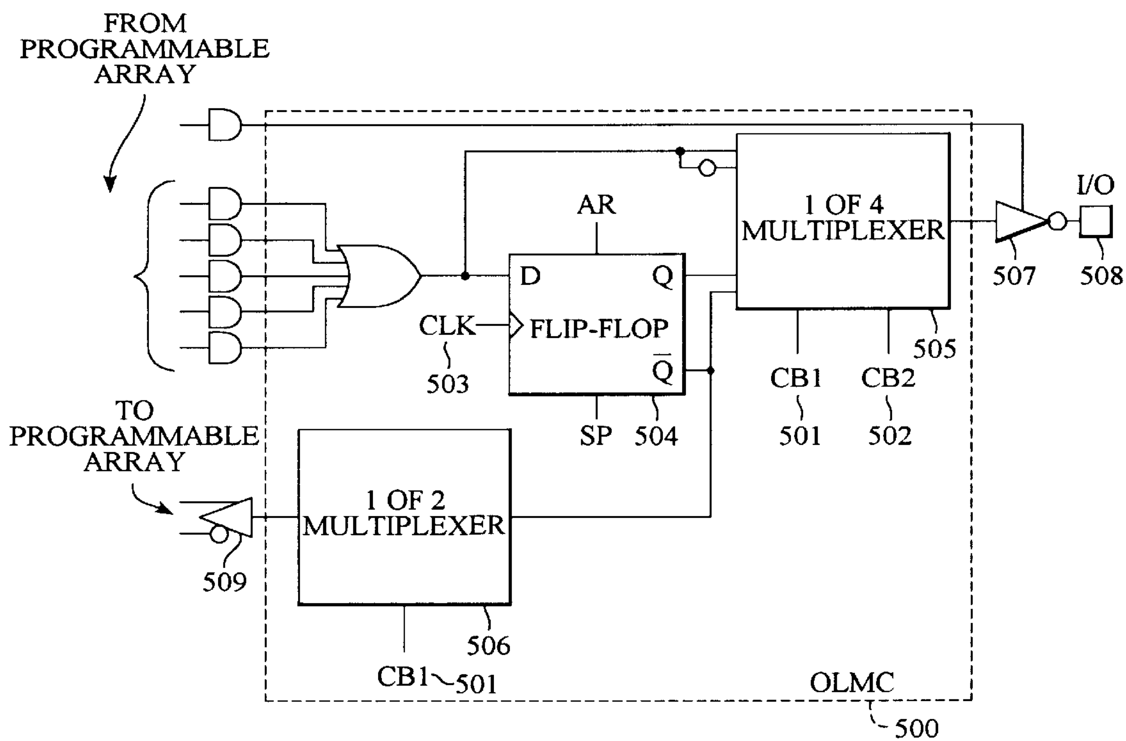
FIG. 4 shows a block diagram/schematic of a typical output logic macrocell, known in the prior art.

An alternative embodiment of this invention is shown in FIG. 2. In this embodiment, the need for using Configuration Bit Latches is eliminated by parallel data connection of the individual configuration bit non-volatile elements (CB) 221 to configuration register bits. FIG. 2 shows the portion of the circuit relating to the configuration register 220. It is assumed that the configuration register 220 is a Test Data Register as defined in the JTAG test structure (and explained in FIG. 1).

Upon initiation by the Power-up Signal 211, the NV sense signal 209 is sent to the gates of the FETS 205 to load the configuration bit non-volatile elements (CB) 221 to the Configuration latches (CL) 230. The outputs of the CL 230 are used as configuration control signals 260 within a macrocell. The Override Enable Signal 203 can be subsequently used to activate testing, and test configuration bits can be loaded through the TDI test pin 201. The test configuration bits are tested through the configuration latch portion of the circuit 230 in accordance with JTAG specs and exit the configuration register 220 via a connection that leads to the TDO (Test Data Output) 290. After testing, the Restore Signal 213 can be used to reload the configuration latches 230. As discussed, this embodiment eliminates the need for the configuration bit sense latches. However, the configuration bits 221 are required to be physically located near the configuration latches 230 in order to avoid having to route each CB output over a long distance.

Figure 3:
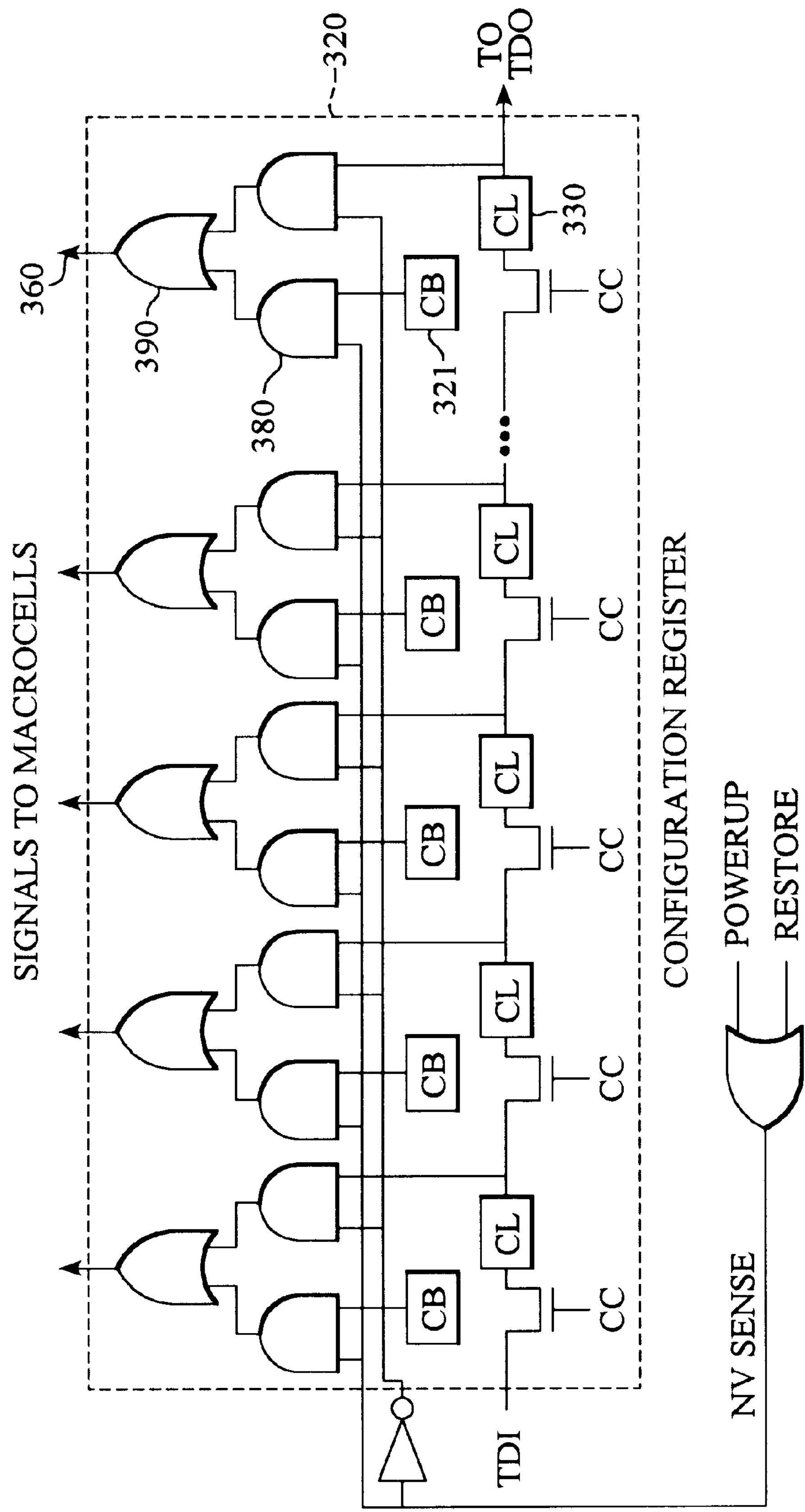
FIG. 3 shows a block diagram/schematic of logically combining the configuration bit and configuration latch output signals within the framework of the present invention.
Figure 5:
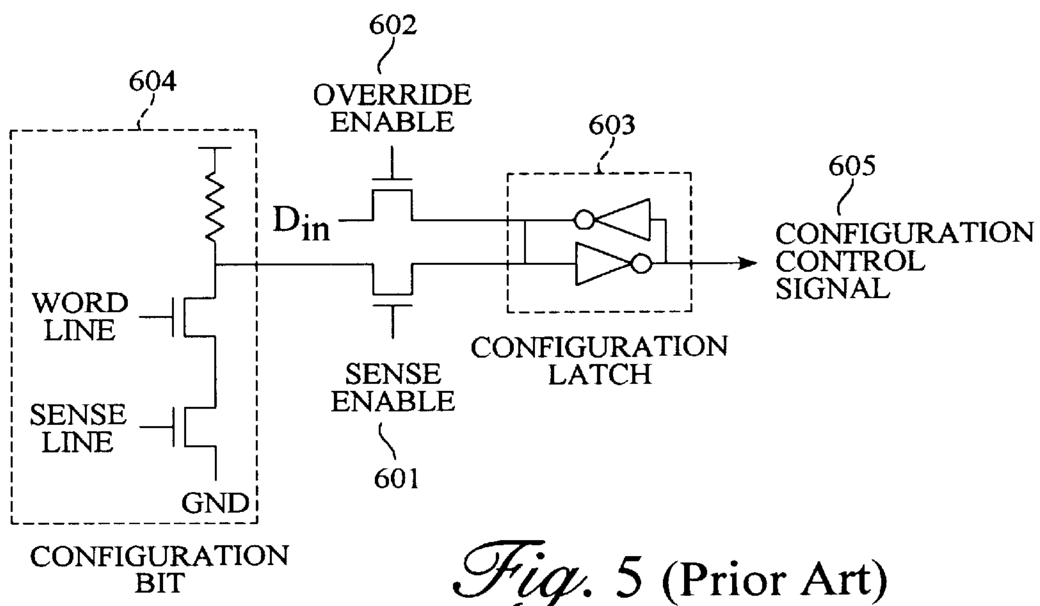
FIG. 5 shows a block diagram/schematic of a configuration latch connection to configuration bit, as known in the prior art.
Figure 6:
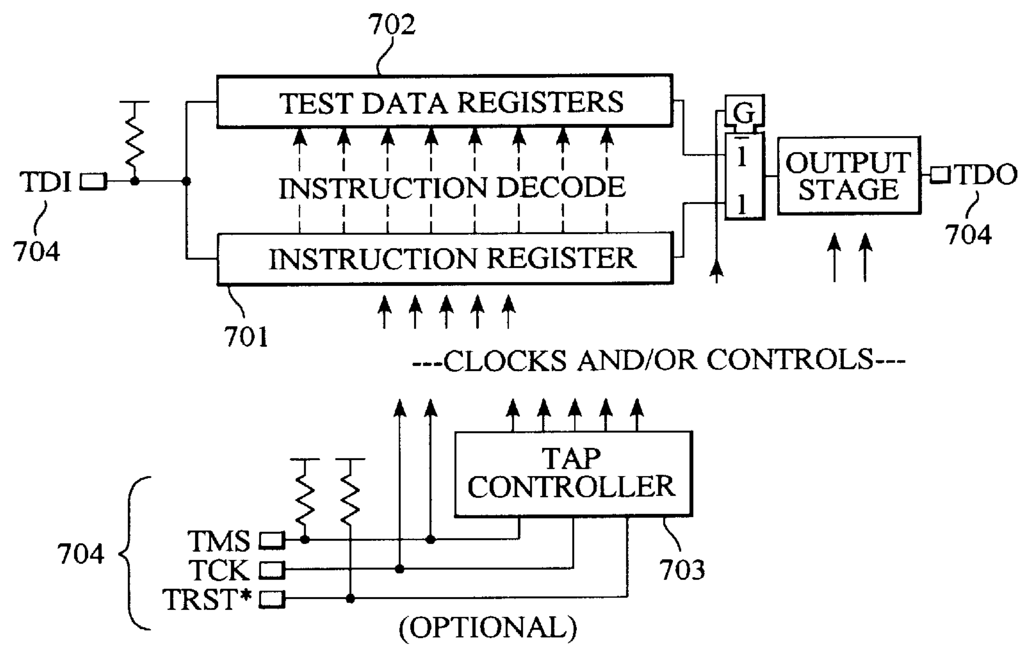
FIG. 6 shows a block diagram/schematic of the JTAG test set up as defined in IEEE 1149.1-1990, as known in the prior art.

Other circuitry may be added to the two embodiments of this invention described above in order to perform additional functions. For example, as shown in FIG. 3, the configuration latches 330 and the configuration bit non-volatile elements 321 can be logically combined (using AND gates 380 and OR gates 390) within the Configuration Register 320 to produce the configuration control signals 360 to the macrocell.

Additionally, this invention's method for controlling programmable bits may be used for other purposes other than controlling bits within a macrocell. These other purposes could include controlling pinout control options, security bits, global logic configuration control bits or speed/power options.

Also, it is possible to apply a control signal to the configuration bits or to the configuration latches in order to hold the configuration control signals in a fixed state during the time that data is being input to the configuration latches or while the configuration bits are being programmed or erased.

Finally, it is anticipated that multiple configuration registers can be connected in parallel within the structure described above in order to process multiple configuration bits at one time.

We claim:

1. A system for controlling registers associated with non-volatile elements of configuration bits in a programmable logic device comprising:

a boundary scan test circuit including a number of external device pins, one of the external device pins being defined as a test data input pin, and at least one test data register which is defined as a configuration register;

a set of serially connected configuration bit non-volatile element sense latches (CBSLs), the CBSLs storing a set of data of the non-volatile elements;

means for processing the set of data of the non-volatile elements from the CBSLs to the configuration register when a first signal is applied; and means for processing a set of test data signals from the test data input pin to the configuration register when a second signal is applied.

2. A system for controlling registers associated with non-volatile elements of configuration bits in a programmable logic device as in claim 1, wherein the configuration register includes a series of serially connected configuration latches and a configuration clock and wherein the configuration register produces an output signal.

3. A system for controlling registers associated with non-volatile elements of configuration bits in a programmable logic device as in claim 2, wherein the output signal is used within an output logic macrocell.

4. A system for controlling registers associated with non-volatile elements of configuration bits in a programmable logic device as in claim 3, wherein the test data input pin is coupled through a first transistor to the configuration register and the CBSLs are coupled through a second transistor to the configuration register.

5. A system for controlling registers associated with non-volatile elements of configuration bits in a programmable logic device as in claim 2, wherein a control signal is applied to the configuration latches such that the output signal remains in a fixed state.

6. A system for controlling registers associated with non-volatile elements of configuration bits in a programmable logic device as in claim 2, wherein the means for processing the set of data of the non-volatile elements includes toggling the configuration clock for a number of cycles, the number of cycles being equal to a bit length of the configuration register.

7. A system for controlling registers associated with non-volatile elements of configuration bits in a programmable logic device as in claim 1, wherein the number of external device pins is five or less.

8. A system for controlling registers associated with non-volatile elements of configuration bits in a programmable logic device comprising:

a boundary scan test circuit that includes: a plurality of external device pins, one of the external device pins being defined as a test data input pin, at least one test data register which is defined as a configuration register, the test data input pin being coupled through a first transistor to the configuration register, the configuration register including a series of serially connected configuration latches and a configuration clock, and producing an output signal;

a set of serially connected configuration bit non-volatile element sense latches (CBSLs) being coupled through a second transistor to the configuration register, the CBSLs storing a set of data of the non-volatile elements;

means for processing the set of data of the non-volatile elements from the CBSLs to the configuration register when a first signal is applied to the second transistor; and means for processing a set of test data signals from the test data input pin to the configuration register when a second signal is applied to the first transistor.

9. A system for controlling registers associated with non-volatile elements of configuration bits in a programmable logic device as in claim 8 wherein the first signal is derived from a defined output of an OR gate, the OR gate having the defined output when a power-up signal or a restore signal is applied to an input of the OR gate.

10. A system for controlling registers associated with non-volatile elements of configuration bits in a programmable logic device as in claim 8, wherein the output signal is used within an output logic macrocell.

11. A system for controlling registers associated with non-volatile elements of configuration bits in a programmable logic device as in claim 8, wherein the means for processing the set of data of the non-volatile elements includes toggling the configuration clock for a number of cycles, the number of cycles being equal to a bit length of the configuration register.

12. A system for controlling registers associated with non-volatile elements of configuration bits in a programmable logic device as in claim 8, wherein the plurality of external device pins consists of five or less pins.

13. A system for controlling registers associated with non-volatile elements of configuration bits in a programmable logic device comprising:

a boundary scan test circuit that includes:

one or more test data registers, at least one of the test data registers being defined as a configuration register; the configuration register producing an output signal and including a series of serially connected configuration latches and a configuration clock;

a number of external device pins, one of the external device pins being defined as the test data input pin, the test data input pin being coupled through a first transistor to the configuration register;

a test access port and a test access port controller;

an instruction register; and a number of clocks and controls;

a set of serially connected configuration bit non-volatile element sense latches (CBSLs) being coupled through a second transistor to the configuration register, the CBSLs storing a set of data of the non-volatile elements;

means for processing the set of data of the non-volatile elements from the CBSLs to the configuration register upon the application of a first signal to a gate of the second transistor, the means including toggling the configuration clock for a number of cycles, the number of cycles being equal to a bit length of the configuration register; and means for processing a set of test data signals from the test data input pin to the configuration register when a second signal is applied to a gate of the first transistor.

14. A system for controlling registers associated with non-volatile elements of configuration bits in a programmable logic device as in claim 13 wherein the output signal is used within an output logic macrocell.

15. A system for controlling registers associated with non-volatile elements of configuration bits in a programmable logic device as in claim 13, wherein the number of external device pins consists of five or less pins.

16. A system for controlling registers associated with non-volatile elements of configuration bits in a programmable logic device comprising:

a boundary scan test circuit including a number of external device pins, one of the external device pins being defined as a test data input pin, the test data input pin being coupled through a first transistor to a configuration register, the configuration register including a series of serially connected configuration latches, the series of configuration latches being connected in parallel to a series of configuration bit non-volatile elements;

the configuration register including a clock and producing an output signal; and means for processing a set of test data signals from the test data input pin to the configuration register when an override signal is applied to the first transistor.

17. A system for controlling registers associated with non-volatile elements of configuration bits in a programmable logic device as in claim 16, wherein the output signal is used within an output logic macrocell.

18. A system for controlling registers associated with non-volatile elements of configuration bits in a programmable logic device as in claim 16, wherein the number of external device pins consists of five or less pins.

* * * * *